United States Patent [19]

Nobel et al.

[11] Patent Number: 4,640,746

[45] Date of Patent: Feb. 3, 1987

[54] BATH AND PROCESS FOR PLATING TIN/LEAD ALLOYS ON COMPOSITE SUBSTRATES

[75] Inventors: Fred I. Nobel, Sands Point; David N. Schram, Freeport, both of N.Y.

[73] Assignee: LeaRonal, Inc., Freeport, N.Y.

[21] Appl. No.: 774,822

[22] Filed: Sep. 11, 1985

Related U.S. Application Data

[63] Continuation-in-part of Ser. No. 659,818, Oct. 11, 1984, which is a continuation-in-part of Ser. No. 423,748, Sep. 27, 1982, abandoned.

[51] Int. Cl.$^4$ ............................................... C25D 5/02
[52] U.S. Cl. .................................................... 204/15
[58] Field of Search ............................... 204/15, 44.4

[56] References Cited

U.S. PATENT DOCUMENTS

| | | | |
|---|---|---|---|
| 3,769,182 | 10/1973 | Hsu | 204/44.4 |
| 3,905,878 | 9/1975 | Dohi et al. | 204/43 S |
| 3,984,291 | 10/1976 | Lerner et al. | 204/43 S |
| 4,000,047 | 12/1976 | Ostrow et al. | 204/43 S |
| 4,118,289 | 10/1978 | Hsu | 204/44.4 |
| 4,163,700 | 8/1979 | Igarashi et al. | 204/43 S |

FOREIGN PATENT DOCUMENTS 2007713 5/1979 United Kingdom .

*Primary Examiner*—T. M. Tufariello
*Attorney, Agent, or Firm*—Pennie & Edmonds

[57] ABSTRACT

An electroplating bath and process for electroplating composite substrates having an electroplatable metallic portion and a non-conductive inorganic portion with a tin-lead alloy which will plate only on the metallic portions of the substrate and not plate on or otherwise adversely affect the non-conductive inorganic portions.

9 Claims, 2 Drawing Figures

BATH AND PROCESS FOR PLATING TIN/LEAD ALLOYS ON COMPOSITE SUBSTRATES

CROSS-REFERENCE TO RELATED APPLICATIONS

This application is a continuation-in-part of application Ser. No. 659,818, filed Oct. 11, 1984, now abandoned which application is a continuation-in-part of application Ser. No. 423,748, filed Sept. 27, 1982, now abandoned.

TECHNICAL FIELD

The field of the invention relates to baths and methods for electroplating tin/lead alloys or solders onto composite substrates having electroplatable metallic portions and non-electroplatable inorganic portions.

BACKGROUND OF THE INVENTION

The electronic components industry is continually searching for new composite materials for use as electrical or electronic components. Such new materials are being developed in accordance with the need for miniaturized parts which are capable of performing various operations.

Many of these composite materials include metallic portions which alone could easily be electroplated utilizing state of the art electroplating baths. When such electroplatable portions are combined in a composite material in combination with a non-conductive, non-electroplatable portion of an inorganic material such as glass, ceramic or the like, it becomes very difficult to selectively plate only the metallic electroplatable portions of the composite without adversely affecting or concurrently electroplating the inorganic portions of the composite.

For example, when the common tin/lead fluoborate baths are utilized to achieve such selective plating, it is found that fluoboric acid attacks the inorganic portions of the composite. This attack may be in the form of solubilizing (i.e., etching or dissolving the inorganic material) or cracking. If the inorganic portion of the composite is etched to a significant extent, then the tin/lead alloy will deposit on the inorganic portion, thus causing a short circuit of the metallic (electroplatable) portions.

Use of tin/lead electrolytes which are not based on fluoborates, such as those disclosed in U.S. Pat. No. 4,459,185, are also not suitable. While baths such as these do not cause cracking of the inorganic portions, they will deposit tin/lead alloys upon such portions, thus causing short circuiting of the metallic portions.

A specific type of electronic component which utilizes a composite structure is a dual inline package (DIP). These components, which are well known in the art, are generally prepared by adhering a die or a chip to a surface and connecting the circuitry to a plurality of pins. The die is then encapsulated with ceramic pieces that are adhered together with a soft lead oxide glass containing about 50% lead oxide that melts at relatively low temperatures. The soft glass binder used to encapsulate the circuit oozes around these pieces and hardens during the fabrication to become part of the package. The structure is thus composed of metallic pins, the encapsulating ceramic, and the hardened soft lead oxide glass encapsulation. In order to continue processing of these packages, the metallic portion (usually an iron-nickel alloy) must be electroplated to facilitate soldering connections to the pins.

The common practice in the industry today is to plate these DIPs with pure tin from a solution containing stannous sulfate and sulfuric acid, since the soft lead oxide glass portions do not accept a tin deposit from such solutions, nor do such plating solutions adversely affect the soft lead glass portions. Pure tin electrodeposits, however, have been known to produce whiskers which grow out from the surface in various directions. These whiskers have the appearance of very fine hairs of tin metal which can bridge adjacent metal parts and cause a short circuit. The industry would like to avoid utilizing pure tin deposits for such packages for this reason.

Attempts have been made to plate DIPs with a tin/-lead alloy containing 5% lead or more, since it is known that these tin-lead alloys do not have a tendency to produce whiskers. The tin/lead plating baths that are commonly used in the industry today, as mentioned above, cannot be used for this purpose since the soft lead glass binder has a tendency to become electroplated, thus causing short circuiting of the pins. Also mentioned above, a further problem is that the soft lead glass binder is soluble in or otherwise adversely affected by such prior art plating solutions.

SUMMARY OF THE INVENTION

The present invention relates to a method for electroplating composite substrates having an electroplatable metallic portion and a non-electroplatable inorganic portion with a tin-lead alloy from an electrolyte which will plate upon the metallic portions and which will not plate or otherwise adversely affect the inorganic portions of the composite. The inorganic (e.g. ceramic or glass) portions are not entirely inert to this electrolyte and some of these portions may be very slightly dissolved. This effect, however, is well known and can be tolerated within acceptable limits of the electronic industry.

The solutions used to plate these substrates according to the invention contain a soluble tin compound in the divalent state, a soluble lead compound in the divalent state, and have a pH of not less than about 1.5 nor greater than about 5.5. These plating solutions also contain a complexing agent to help maintain the tin and lead metals in solution above the minimum pH. These plating solutions also do not contain appreciable amounts of free acid or base components. These baths may also contain an additive of an alkylene oxide or imidazoline compound.

The invention also relates to a method for preparing the electroplating solutions of the invention which comprises adding to water, the tin and lead compounds together with the complexing agent and adjusting the pH to between about 1.5 and 5.5 by the addition of a suitable base or acid compound to remove any free acid or free base from the electrolyte.

The use of such electrolytes for electroplating a substrate having an electroplatable metallic portion and a non-electroplatable, non-conductive inorganic portion results in a tin/lead deposit on the metallic portions which does not have a tendency to grow whiskers, and does not plate or otherwise adversely affect the non-electroplatable portion. Thus, the prior art problems of short circuiting of the pins and the adverse effect on the glass or ceramic portions are eliminated by the plating baths of this invention.

BRIEF DESCRIPTION OF THE DRAWINGS

The nature, advantages, and various other additional features of the invention will appear more fully upon consideration of the illustrative embodiments now to be described in detail in connection with the accompanying drawing figures, wherein.

DETAILED DESCRIPTION OF THE PREFERRED EMBODIMENTS

In the description that follows, the term "composite material" generally refers to a material having one or more electroplatable portions and one or more non-electroplatable portions. The electroplatable portions are generally metallic, i.e., having a metal character. These portions may be of wrought metal, or of a metal coating or electroplated deposit.

The non-electroplatable portions usually comprise an inorganic material. The term "inorganic material" is used to mean a ceramic, glass, or refractory material which primarily includes various metal oxides, such as lead, aluminum, silicon, zirconium, or titanium oxides and the like.

Figure 1:
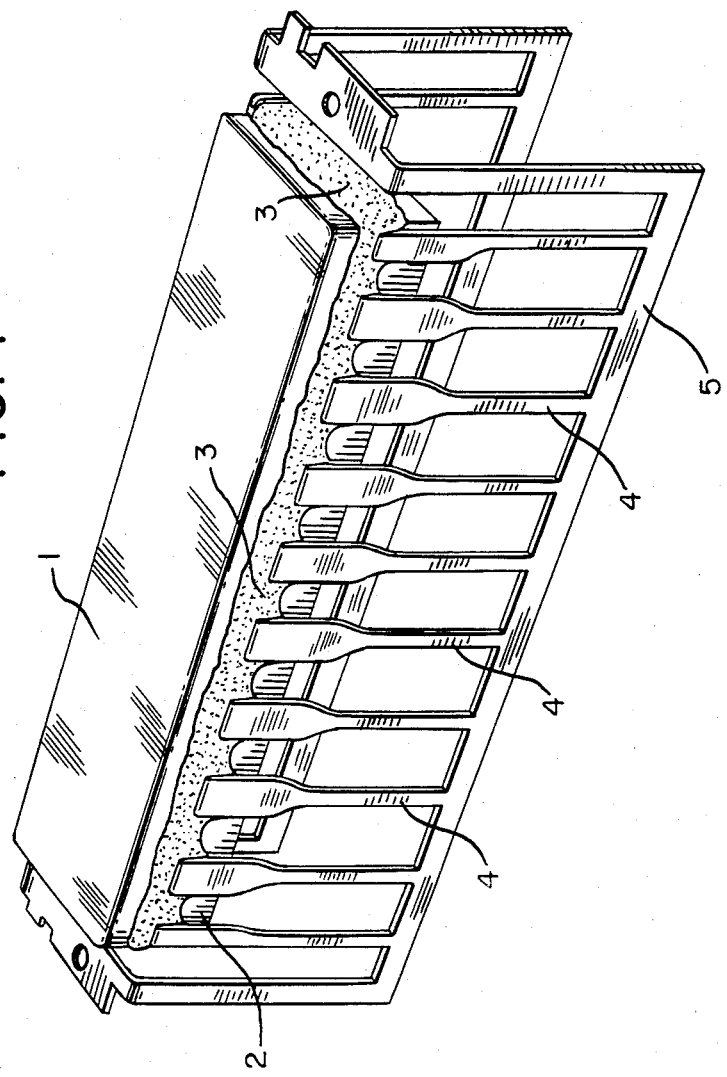
FIG. 1 is a prospective view of one type of a ceramic DIP.

Referring initially to FIG. 1, there is illustrated an electrical component commonly known as a dual inline package or DIP. The circuity (not shown) is encapsulated by means of ceramic pieces 1 and 2 which are held together by means of a soft lead oxide glass 3. The encased circuitry is properly connected to the metal alloy pins 4. The tie bars 5 are removed after electroplating.

The soft lead oxide glasses used in these DIPs are well known. The melting point of these glasses will be mainly determined by the percentage of lead oxide in the glass. An example of a soft lead oxide glass which is commonly used in the electronic industry for encapsulation of duel inline packages contains about 50 percent by weight lead oxide, 25 percent silicon dioxide, 10 percent $Al_2O_3$, 10 percent $B_2O_3$ and 5 percent miscellaneous oxides such as zinc, lithium and manganese oxides.

Figure 2:
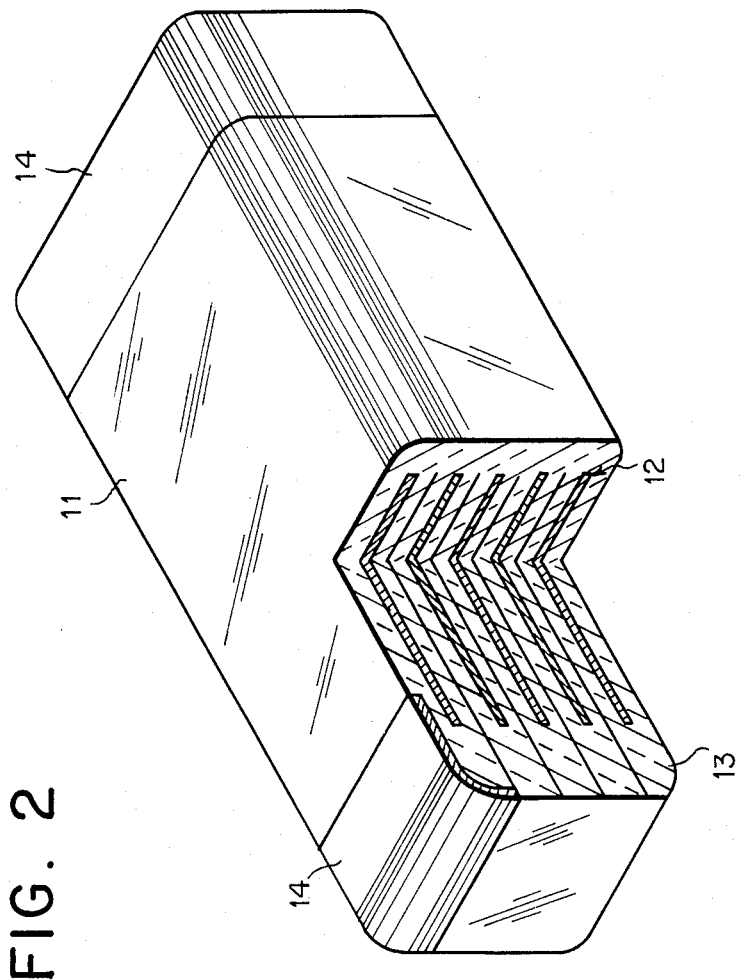
FIG. 2 is a view partially in cross-section of a multiple layer ceramic chip capacitor.

Referring now to FIG. 2, there is illustrated an electrical compound known as a multiple layer ceramic chip capacitor. The monolithic construction utilized in producing these chips results in a solid block of ceramic 11, with enclosed electrodes 12 and dielectric 13. The ends of these chips are metallized 14 for circuit attachment. These type chips can be used as capacitors, while similar type chips can be used as resistors or other electronic components.

The process of this invention is applicable in general to all composite materials having electroplatable (e.g. metallic) portions and inorganic (e.g. ceramic or glass) portions, particularly when the inorganic portion will be adversely affected or will be plated with a tin/lead deposit at least to some extent when attempts are made to plate the metallic portion of the composite with conventional fluoborate tin/lead plating solutions presently on the market.

Selective tin/lead alloy plating upon the electroplatable portions of these composite substrates is achieved through the use of the baths of the invention. These baths generally include at least one soluble tin compound, one soluble lead compound, a complexing agent and a pH of preferably between about 1.5 and about 5.5. Furthermore, these baths should not contain substantial amounts of free acid or base components.

The tin and lead compounds may be added to the plating solutions in the divalent state in the form of any soluble salt. Some non-limiting examples include tin sulfate, tin citrate, tin pyrophosphate, tin alkane or alkanol sulfonates, tin fluoborate, tin gluconate, tin tartrate, etc., lead acetate, lead alkane or alkanol sulfonates, lead gluconate, lead tartrate, lead pyrophosphate, etc.

A wide variety of complexing or chelating agents may be employed to maintain the tin and lead metals in solution at the preferred pH values. Some examples of these complexing or solubilizing agents include solution soluble salts of gluconates, pyrophosphates, malonates, citrates, malates, or tartrates; organic acids such as malic, malonic or citric acids; and alkali salts of such organic acids.

Specific preferred compounds include sodium gluconate, potassium pyrophosphate, potassium sodium tartrate (Rochelle Salts), ammonium citrate, hydroxy ethylidene diphosphonic acid, nitrilo tri-methyl phosphonic acid, and hydroxy acetic acid or one of their alkali salts. Other compounds, such as glucose, for example, are operable as complexing agents, but are not practically or economically feasible due to the quantities required. Certain compounds are useful with particular baths, while other compounds, such as EDTA, lactic acid and glycine, for example, do not work very well to maintain the solubility of the metals in an alkane or alkanol sulfonate environment. The most advantageous complexing agent for any particular plating solution can be determined by routine experimentation.

The pH of the plating solutions of the present invention can range depending upon the amounts and types of additives used. The pH must be sufficient to produce a desired tin/lead deposit without detrimentally affecting the glass or ceramic portions or without causing bridging or short circuiting between adjacent spaced metallic portions. Preferably, the pH of the plating solution should be a least about 1.5, and it is particularly advantageous to operate at a pH between about 3 and 4. Higher pHs, generally up to about 5.5 can also be used, but the lower pH values provide better cathode efficiencies.

As the pH of the solution is increased above about 5.5, the inorganic portion becomes more sensitive to the plating solution. Thus, the pH of the solution must be maintained below that which will adversely affect (solubility, for example) this inorganic portion as well as below that which will result in bridging. Additionally, maintaining the lead and tin metals in solution becomes extremely difficult at pH values higher than about 6.

After adding the metals and complexing agent to the bath, the pH of the resultant electrolyte is adjusted to the preferred range of between about 3 and 4 by the addition of a base or basic compound. This pH adjustment substantially eliminates any free acid in the bath by converting such acid to its corresponding salt. Preferred bases for pH adjustment include alkali hydroxides such as sodium or potassium hydroxide and the like. Ammonia or an ammonium salt may be utilized for pH adjustment, provided that the amount utilized does not provide an excess ammonia in the bath environment. A typical maximum concentration of such ammonium compounds is about 30 g/l or about 5% of the overall bath composition to avoid the problems discussed previously.

Thus, in order to achieve the necessary selective plating of these composite substrates, it is important to avoid the use of substantial amounts of ammonia in the bath. Common sources of ammonia include free ammonia for providing an alkaline bath environment and various ammonium salt complexing agents. Typical patents disclosing the use of excess amounts of these additives include U.S. Pat. No. 4,163,700 or British Patent Publication No. 2,007,713. The high ammonia and ammonium content of these baths causes the problems discussed previously.

The amount of base or basic component utilized for pH adjustment must be relatively low for two reasons:

large amounts of base will raise the pH above 6 where the bath is unstable and the metals will precipitate; or large amounts of base adversely affect the inorganic portions of the substrate as discussed previously.

Although matte deposits are acceptable, it is preferred to obtain bright or lustrous deposits by adding a grain refiner or brightener to the plating solution. In this connection, the same kind of grain refiners or brighteners commonly used for solder plating from the conventional fluoboric acid plating baths are suitable. Preferred additives include the known alkylene oxide compounds (i.e., those compounds containing ethylene or propylene oxide condensates). Suitable brighteners also include wetting agents containing imidazoline compounds. The quantities used of these compounds are the same as those used in conventional tin/lead plating solutions, and would be known to one skilled in the art.

EXAMPLES

The scope of the invention is further described in connection with following examples which are set forth for the sole purpose of illustrating the preferred embodiments of the invention and which are not to be construed as limiting the scope of the invention in any manner.

The following plating baths were prepared for plating combined glass-metallic substrates:

EXAMPLE 1

(Comparative Example)

The bath disclosed in Example 4 of U.S. Pat. No. 4,163,700. The solubilizing or complexing agent is ammonium citrate. Although this bath produces a tin/lead deposit with or without the brightening agents (since matte deposits are acceptable), the bath attacked the leaded glass portions of the substrate due to its high ammonia content, and the resulting plated deposit showed severe bridging.

EXAMPLE 2

(Comparative Example)

The bath disclosed in Example 1 of U.S. Pat. No. 3,984,291. In this bath, tin is added as stannous pyrophosphate, lead as lead tartrate or lead pyrophosphate. As solubilizing or complexing agents, potassium pyrophosphate and rochelle salts are present. The bath pH is adjusted to 8.5. As in Example 1, a tin/lead alloy was deposited on the metallic portions of the substrate, but the leaded glass portions were severely attacked by this relatively high pH, high ammonia/ammonium content bath.

EXAMPLE 3

Tin metal, 12 g/l, as stannous methane sulfonate, lead metal, 4 g/l, as lead methane sulfonate and citric acid, 100 g/l, adjusted to a pH of about 4 with sodium hydroxide.

EXAMPLE 4

Tin metal, 15 g/l, as tin fluoborate, lead metal, 3 g/l, as lead acetate, and sodium gluconate, 100 g/l. The bath is adjusted to a pH of about 3 with either sodium hydroxide, or gluconic acid.

EXAMPLE 5

Tin metal, 15 g/l, as stannous gluconate, lead metal, 3 g/l, as lead acetate, sodium gluconate, 100 g/l and sodium malate, 55 g/l. The pH of the bath is adjusted to about 3 with sodium hydroxide.

DIPs were then rack plated with the above baths at room temperature under mild agitation and between 10 and 15 ASF to a thickness of 200 microinches. The appearance of the deposits in Examples 3, 4, and 5 were found to be uniform matte. The lead glass binder did not accept any substantial plating and no bridging between the pins was observed. Also, the glass portions of the substrate were not significantly attacked by the baths of the last 3 Examples.

While it is apparent that the invention herein disclosed is well calculated to fulfill the desired results, it will be appreciated that numerous modifications and embodiments may be devised by those skilled in the art, and it is intended that the appended claims cover all such modifications and embodiments as fall within the true spirit and scope of the present invention.

We claim:

1. A process for electroplating a composite substrate having an electroplatable portion and a non-electroplatable portion which comprises electroplating said composite substrate with a solution containing at least one soluble tin and at least one soluble lead compound in which the tin and lead are in the divalent state, and a complexing agent of a soluble salt of a gluconate, pyrophosphate, citrate, malate, tartrate or malonate, said solution having a pH of between about 1.5 and about 5.5, and containing less than about 30 g/l or about 5% of the overall solution of ammonia or ammonium compounds, to produce a desired tin/lead electrodeposit upon the electroplatable portion without adversely affecting or plating upon the non-electroplatable portion of the substrate.

2. A process for electroplating an electronic component having an electroplatable metallic portion and a non-electroplatable glass or ceramic portion which comprises electroplating said component with a solution containing a soluble divalent tin compound, a soluble divalent lead compound, a complexing agent of a soluble salt of a gluconate, pyrophosphate, citrate, malate, tartrate or malonate for maintaining these compounds in the solution, and an additive of an alkylene oxide or imidazoline compound, said solution having a pH of between about 1.5 and about 5.5, and having less than about 30 g/l or 5% of the overall solution of ammonia or ammonium compounds, to produce a desired tin-lead composition upon the metallic portion without adversely affecting or without plating upon the glass or ceramic portion of the substrate.

3. The process of claim 1 wherein the electroplating solution is prepared by adding the tin and lead compounds and the complexing agent to water and adjusting the pH to the claimed range by addition of a suitable base or acid compound to neutralize any free acid or base in the electrolyte.

4. The process of claim 2 wherein the electroplating solution is prepared by adding the tin and lead compounds, the complexing agent and the brightener to water and adjusting the pH to the claimed range by the addition of a suitable base or acid compound to neutralize any free acid or base in the electrolyte.

5. A process for electroplating a composite substrate having an electroplatable portion and a non-electroplatable portion which comprises electroplating the electroplatable portion of said substrate with a tin/lead alloy electroplating solution comprising a soluble divalent tin compound; a soluble divalent lead compound; a complexing agent of a solution soluble salt of a gluconate, pyrophosphate, citrate, malate, tartrate or malonate; and a brightener of an alkylene oxide or imidazoline compound; said solution having a pH in the range of about 1.5 to 4 and containing less than about 30 g/l or about 5% of the overall solution of ammonia or ammonium compounds to produce a desired tin-lead composition upon the electroplatable portion without adversely affecting or plating upon the non-electroplatable portion of the substrate.

6. The process of claim 5 wherein the electroplating solution is prepared by adding the tin and lead compounds, the complexing agent and the brightener to water and adjusting the pH to the claimed range by the addition of a suitable base or acid compound to neutralize any free acid or base in the electrolyte.

7. A process for electroplating a composite substrate having an electroplatable portion and a non-electroplatable portion which comprises electroplating the electroplatable portion of said substrate with a tin/lead alloy electroplating solution comprising a soluble divalent tin compound and a soluble divalent lead compound, each in an amount sufficient to obtain a desired tin-lead alloy deposit, a complexing agent in an amount sufficient to maintain the tin and lead compounds in said solution; said solution having a pH in the range of about 1.5 to 4 and having less than about 30 g/l or about 5% of the overall solution of ammonia or ammonium compounds, to produce a desired tin-lead composition upon the electroplatable portion without adversely affecting or electroplating upon the non-electroplatable portion of the substrate.

8. The process of claim 7 wherein the electroplating solution further comprises a brightener of an alkylene oxide or imidazoline compound.

9. The process of claim 8 wherein the electroplating solution is prepared by adding the tin and lead compounds, the complexing agent and the brightener to water and adjusting the pH to the claimed range by the addition of a suitable base or acid compound to neutralize any free acid or base in the electrolyte.

* * * * *